United States Patent [19]
Lang et al.

[11] Patent Number: 5,478,801
[45] Date of Patent: Dec. 26, 1995

[54] PROCESS FOR PRODUCING TUBULAR PARTS OF HIGH-$T_c$ SUPERCONDUCTOR MATERIAL

[75] Inventors: Christoph Lang; Iris Küllmer, both of Frankfurt am Main; Joachim Bock, Erftstadt, all of Germany

[73] Assignee: Hoechst Aktiengesellschaft, Frankfurt am Main, Germany

[21] Appl. No.: 267,018

[22] Filed: Jun. 21, 1994

[30]    Foreign Application Priority Data

Jun. 23, 1993 [DE] Germany ............. 43 20 753.7

[51] Int. Cl.$^6$ ..................................... H01L 39/12
[52] U.S. Cl. ............. 505/492; 505/490; 505/739; 505/741; 505/501; 427/62; 264/61
[58] Field of Search .................. 505/741, 739, 505/740, 782, 490, 492, 501; 427/62, 63; 264/61

[56]             References Cited

U.S. PATENT DOCUMENTS

| | | | |
|---|---|---|---|
| 4,973,575 | 11/1990 | Capone ........................... | 156/603 |
| 5,047,391 | 9/1991 | Bock et al. ....................... | 505/1 |
| 5,106,824 | 4/1992 | Uno et al. ........................ | 505/725 |
| 5,151,407 | 9/1992 | Provenzano et al. ............ | 505/450 |
| 5,192,739 | 3/1993 | Lay .................................. | 505/739 |
| 5,272,132 | 12/1993 | Gyorgy et al. .................... | 264/61 |
| 5,328,890 | 7/1994 | Preisler et al. ................... | 505/450 |

FOREIGN PATENT DOCUMENTS

| | | |
|---|---|---|
| 2043438 | 12/1991 | Canada . |
| 441219 | 8/1991 | European Pat. Off. . |
| 462409 | 12/1993 | European Pat. Off. . |
| 571885 | 12/1993 | European Pat. Off. . |
| 3830092 | 3/1990 | Germany . |
| 4019368 | 12/1991 | Germany . |
| 1-224224 | 9/1989 | Japan . |
| 1-278420 | 11/1989 | Japan . |
| 2-141460 | 5/1990 | Japan . |
| 3-105810 | 5/1991 | Japan . |
| 4-160051 | 6/1992 | Japan . |

*Primary Examiner*—Roy V. King
*Attorney, Agent, or Firm*—Foley & Lardner

[57]             ABSTRACT

The invention relates to a process for producing cylindrical or round parts of high-$T_c$ superconductor material comprising bismuth, strontium, calcium, copper and oxygen. In this process, a pre-prepared finely-divided oxide mixture with organic additives is first introduced at room temperature into a casting mold. The shaped mixture is then converted into the superconducting shaped part by subsequent thermal treatment.

19 Claims, No Drawings

PROCESS FOR PRODUCING TUBULAR PARTS OF HIGH-$T_c$ SUPERCONDUCTOR MATERIAL

FIELD OF THE INVENTION

The present invention describes a process for producing cylindrical or round parts of high-$T_c$ superconductors comprising the oxides of the metals Bi, Sr, Ca and Cu.

Description of Related Art

An important field of application of ceramic high-temperature superconductors is electrical engineering. Here it is essential that the ceramic material be processed via a shaping process for the respective application. There has been an advance in this direction for the material $Bi_2Sr_2CaCu_2O_{8+x}$ wherein x is a value between 0 and 2 by the introduction of a melt casting process which is described in DE-A-38 30 092. According to this, parts of solid material such as rods, plates, etc. can be obtained. An expansion of the forming possibilities is shaping via centrifugal casting of the ceramic melt. This technique is described in DE-A 40 19 368. However, processing according to the teaching of this publication has significant limitations with regard to the dimensions of the shaped parts which are achievable thereby. The thickness of the centrifugally cast material is, for reasons of stability, in the millimeter to centimeter range and the diameter of rings or of tubes is very limited. In addition, the achievable critical current density of these solid material samples is greatly in need of improvement because texturing of the electrically anisotropic material is practically impossible to carry out.

The tape casting described by J. Shiomoyama et al. in Jpn. 1. Appl. Phys. Vol. 31 (1992), p. 163–165 which, for the system $Bi_2Sr_2CaCu_2O_{8+x}$, leads to high current densities, also does not have unlimited suitability for rings or similar round geometries, since the subsequent shaping gives rise to seams which in turn have a limiting effect on the critical current density.

Summary of the Invention

It is therefore an object of the invention to develop a novel process by which shaped parts of high-$T_c$ superconducting material having high critical current densities and variable geometry can be produced.

This object is achieved by a process of the generic type mentioned in the introduction, whose distinguishing features are that a pre-prepared, castable mixture of the oxides with further organic additives is introduced into a casting mold and that the shaped mixture is then converted into the high-$T_c$ superconducting shaped part by subsequent thermal treatment.

The process of the invention combines the advantages of centrifugal casting with those of tape casting and makes it possible to apply thin layers having a reproducible layer thickness onto substrate material at room temperature using optimized precursor material in an organic formulation and, with suitable subsequent thermal treatment, to convert into tubular components having high critical current densities.

Detailed Description

A number of demands have to be made of the pulverulent ceramic starting material (precursor material) for processing with an organic formulation to give a slip. The mean particle size (the $d_{50}$ value) should be small and the element distribution, i.e. the distribution of the various phases in the precursor material, should be very homogeneous. The more reproducible the properties of the material used, the more reproducible are the properties of the slip and, in the end, also the superconducting properties of the shaped part produced from the slip.

The preferred starting material can be a wet-chemically produced precursor material which has been produced via a SOL-GEL process, via a solution process such as freeze drying or via coprecipitation such as oxalate precipitation.

For the pre-preparation, the precursor material is, in particular, thermally treated. For this purpose the coprecipitate is, for example, decomposed over a time period of from 10 minutes to 2 hours at temperatures in the range from 250° to 800° C. in an oxygen-containing atmosphere.

The organic additives added to the oxides are dispersing aids, plasticizers and binders. Suitable dispersing aids are compounds such as tertiary alkoxylamine having an alkyl group having from 10 to 21 carbon atoms. The plasticizers used can be, for example, phthalic esters. Suitable binders are long-chain organic esters having at least 17 carbon atoms.

To make the mixture of metal oxides and organic acids castable, there is also added a solvent mixture which preferably comprises toluene and ethanol in the ratio of from 20 to 40% by weight of toluene and from 60 to 80% by weight of ethanol. Preferably, a casting composition thus produced comprises from 50 to 60% by weight of ceramic material, from 30 to 45% by weight of solvent, from 0.2 to 4% by weight of dispersant, from 1 to 6% by weight of binder and from 0.2 to 2% by weight of plasticizer, in each case based on the total weight of the casting composition.

The process of the invention also enables round or tubular geometries to be coated, supplementing the tape casting process. For this purpose, a suitable substrate is fixed in a mold of any desired material, the mold being rotatable on bearings. During rotation, the slip based on the coprecipitated BSCCO precursor material is fed into the mold onto the substrate surface. The rotation distributes the slip uniformly, while the solvent begins to evaporate. This results in a green sheet which has a uniform thickness and a homogeneous distribution of the precursor. The component is then subjected to a subsequent thermal treatment which leads to the substrate/superconductor composite. If the substrate material is Ag and the superconductor is $Bi_2Sr_2CaCu_2O_{8+x}$, a partial melting step and subsequent slow crystallization can be used to obtain a tubular component having a superconducting, dense, highly textured layer having a thickness down to 10 μm and a critical current density (measured on short samples over about 1 cm) up to $10^4$ A/cm$^2$.

A further advantage of the process of the invention is that, by means of a plurality of centrifugal slip casting steps, laminates having any combination of (ceramic) substrate and superconductor can be obtained. Thus, in the first step, a ceramic slip (e.g. $Al_2O_3$) can be used to produce a shaped substrate of any thickness after burnout of the organics. In a second step, any desired technique is used to apply a barrier layer, preferably silver, which prevents particle diffusion into the superconductor. If Ag is applied to $Al_2O_3$, well suited application processes are galvanic silvering, sputtering or mechanical application of a layer to be fired. The barrier layer can then be coated with the superconductor slip and the laminate again thermally converted into the superconducting component. In a similar way, a plurality of substrate/superconductor coatings in any order can be obtained.

The above described procedure is particularly suitable for lowering the thickness of the barrier layer. Thus, for the use of $Bi_2Sr_2CaCu_2O_{8+x}$ on Ag in the alternating current field, it is important to minimize the proportion of metal so as to reduce alternating current losses. In general, the materials for these barrier layers (buffer layers) are also of higher value than the substrate material so that there is also an added economic aspect.

In the following examples, which serve to illustrate the invention, material produced by coprecipitation was used. The casting method employed in the examples is a doctor blade process.

EXAMPLES

Example 1

An oxalate coprecipitate having the formal composition $Bi_2Sr_2CaCu_2$ is precalcined at 450° C. There essentially results a finely-divided, homogeneous oxide mixture which is processed into a slip using 38% by weight of solvent mixture (toluene/ethanol 32:68), 1% by weight of dispersant (®Genamin CO 20, Hoechst AG), 3% by weight of binder (®Acryloid, Rhom and Haas) and 2% by weight of plasticizer (®Palatinol C, BASF AG). In the first step, the precalcined precursor is homogenized with the solvent and the dispersant for 3 hours in a tumbler, then the suspension is degassed using ultrasound. The binder and plasticizer are subsequently added and the mixture is again homogenized in the tumbler for 3 hours and degassed. A piece of Ag tube having a wall thickness of 100 µm is subsequently fitted into a rotatable hollow cylinder of aluminum having a diameter of 4 cm and a height of 4 cm. At 3000 revolutions, about 2 ml of slip having a solids content of about 60% are injected. After evaporation of the toluene/ethanol solvent mixture, there results a crack-free green layer having a thickness of about 50–60 µm. In a subsequent thermal treatment of 2 hours at 500° C., the remaining organics are very substantially driven off. Heating up at 2.5 K/min is followed by a partial melting step at 885° C. over a time interval of 10 min with subsequent recrystallization between 875° and 850° C. at a cooling rate of 1° C./h. After subsequent annealing for 2 h under Ar at 650° C., the film has a superconducting transition temperature ($T_c$) of 91 K and critical current densities (measured on short samples made therefrom) of up to $1 \cdot 10^4$ A/cm². X-ray shows the presence of a c-axis orientation of >95%. The film thus produced has a mean thickness of 20 µm, determined by optical examination of polished sections.

Example 2

The production of the precursor material and the processing into a slip are carried out in a similar way to Example 1. By injection onto a silver cylinder adjacent to a rotatable aluminum cylinder, a 2 mm thick green layer is produced at 2000 rpm. After evaporation of the solvent, the variation in the layer thickness is about 10%. The partial melting step after the heating-up step at 3 K/min takes 5 minutes at 890° C., the recrystallization is carried out between 870° and 850° C. at a cooling rate of 2 K/h. The superconducting film thus produced has a mean thickness of 1 mm. After identical annealing under Ar, it has a $T_c$ of 90 K and a $J_c$ of 6300 A/cm² (short sample made therefrom).

Example 3

The production of the precursor material and the processing into a slip are carried out in a similar way to Example 1. By injection onto the silver cylinder, an approximately 25 µm thick green layer is produced at 2500 rpm. After evaporation of the solvent, the variation in the layer thickness is about 20%. The partial melting step after the heating-up step at 3 K/min takes 10 minutes at 885° C. the recrystallization is carried out between 872° and 850° C. at 1 K/h. The superconducting film has a mean thickness of 12 µm. After 2 hours annealing under Ar, it has a $T_c$ or 92 K with a transition width of 0.8 K and a $J_c$ of 8200 A/cm² (short sample made therefrom).

We claim:

1. A process for preparing cylindrical or round bodies made of high-$T_c$ superconducting material comprising at least bismuth, strontium, calcium and copper, said process comprising:
    (a) preparing a mixture of the oxides of said bismuth, strontium, calcium and copper and organic additives;
    (b) shaping said mixture by introducing the mixture at room temperature into a rotating casting mold; and
    (c) converting the shaped mixture of step (b) by heat treating into the superconducting bodies.

2. The process as claimed in claim 1, wherein said bismuth is partially replaced by lead.

3. The process as claimed in claim 2, wherein the bodies made of high-$T_c$ superconducting material comprises crystalline phases having the composition of $Bi_2Sr_2CaCu_2O_{8+x}$, wherein x has a value between 0 and 2.

4. The process as claimed in claim 2, wherein the bodies made of high-$T_c$ superconducting material comprises crystalline phases having the composition of $Bi_2Sr_2CaCu_2O_{10+x}$, wherein x has a value between 0 and 2.

5. The process as claimed in claim 1, wherein the oxides of said metals for the preparation of the mixture of step (a) comprise a homogenous, coprecipitate of oxalates of the metals.

6. The process as claimed in claim 5, wherein the oxalates are decomposed at temperatures between 250° and 800° C.

7. The process as claimed in claim 1, wherein the organic additives comprise a solvent, a dispersant, a binder and a plasticizer.

8. The process as claimed in claim 7, wherein the solvent comprises a mixture of toluene and ethanol in the ratio of from 20 to 40% by weight of toluene and from 60 to 80% by weight of ethanol.

9. The process as claimed in claim 7, wherein the dispersant comprises a tertiary alkoxylamine having from 10 to 21 carbon atoms in its alkylgroup.

10. The process as claimed in claim 7, wherein the binder comprises a long-chain organic ester having at least 17 carbon atoms.

11. The process as claimed in claim 7, wherein the plasticizer comprises a phthalic acid ester.

12. The process as claimed in claim 1, wherein the prepared mixture comprises oxidic material in an amount from 50 to 60% by weight, solvent in an amount from 30 to 45% by weight, dispersant in an amount from 0.2 to 4% by weight, binder in an amount from 1 to 6% by weight and plasicizer in an amount from 0.2 to 2% by weight, each calculated on total weight of the mixture.

13. The process as claimed in claim 1, wherein a rotation rate of said rotating mold is adjusted within the range from 100 to 6000 rpm.

14. The process as claimed in claim 1, wherein a rotation rate of said rotating mold is adjusted within the range from 2000 to 3000 rpm.

15. The process as claimed in claim 1, wherein the casting mold comprises a tubular shaped component made of silver.

16. The process as claimed in claim 1, wherein the casting mold comprises a tubular shaped component made of silver-coated ceramic material.

17. The process as claimed in claim 1, wherein the cross section of the casitng mold is reduced at its open end face by an end ring.

18. The process as claimed in claim 1, wherein the heat treatment is conducted at temperatures within the range of between 600° and 920° C.

19. The process as claimed in claim 1, wherein the heat treatment is conducted over a time period within the range of between 3 min and 2 h.

* * * * *